United States Patent [19]

Slocum et al.

[11] Patent Number: 5,758,776

[45] Date of Patent: Jun. 2, 1998

[54] INTEGRATED CIRCUIT TRAY WITH FLEXURAL BEARINGS

[75] Inventors: Alexander H. Slocum, Bow, N.H.; R. Scott Ziegenhagen, II, San Jose, Calif.; Richard W. Slocum, III, Nicholasville, Ky.; Luis A. Muller, Cambridge, Mass.

[73] Assignee: Kinetrix, Inc., Bedford, N.H.

[21] Appl. No.: 653,588

[22] Filed: Sep. 12, 1996

[51] Int. Cl.$^6$ ............................................. B65D 73/02
[52] U.S. Cl. ........................ 206/714; 206/725; 206/728; 220/339
[58] Field of Search ................................. 206/701, 714, 206/722, 725, 726, 728, 564, 562, 724; 220/339, 334

[56] References Cited

U.S. PATENT DOCUMENTS

| | | |
|---|---|---|
| 3,604,557 | 9/1971 | Cedrone . |
| 3,892,312 | 7/1975 | Tems . |
| 4,073,381 | 2/1978 | Patterson . |
| 4,379,505 | 4/1983 | Alemanni . |
| 4,444,309 | 4/1984 | Morton, Jr. . |
| 4,547,794 | 10/1985 | Tang . |
| 4,549,651 | 10/1985 | Alemanni . |
| 4,591,053 | 5/1986 | Alemanni . |
| 4,681,221 | 7/1987 | Chickanosky et al. . |
| 4,718,548 | 1/1988 | Estrada et al. ............................. 206/329 |
| 4,747,483 | 5/1988 | Grabbe . |
| 4,991,714 | 2/1991 | Clatanoff . |
| 5,066,245 | 11/1991 | Walker . |
| 5,080,228 | 1/1992 | Maston, III et al. . |
| 5,131,535 | 7/1992 | O'Connor et al. . |
| 5,184,068 | 2/1993 | Twigg et al. . |
| 5,203,452 | 4/1993 | Small et al. . |
| 5,291,994 | 3/1994 | Murphy . |
| 5,310,076 | 5/1994 | Burton et al. . |
| 5,375,710 | 12/1994 | Hayakawa et al. . |
| 5,400,904 | 3/1995 | Maston, III et al. . |
| 5,418,692 | 5/1995 | Nemoto . |
| 5,423,422 | 6/1995 | Boire et al. . |
| 5,481,438 | 1/1996 | Nemoto . |
| 5,526,936 | 6/1996 | Matsuzoe . |
| 5,568,868 | 10/1996 | Keller et al. ............................. 206/724 |
| 5,584,717 | 12/1996 | Radde et al. ............................. 439/330 |

*Primary Examiner*—Paul T. Sewell
*Assistant Examiner*—Nhan T. Lam
*Attorney, Agent, or Firm*—Edmund J. Walsh

[57] ABSTRACT

A semiconductor chip tray holding chips in individual bins that can each be independently moved with six degrees of freedom. The bins are held in the tray with a flexural bearing system. The flexural bearing system centers the chips at a nominal position allows compliant motion of the bins. The flexural bearing system is made of four beams, with pairs joined at right angles through flexural bearings.

22 Claims, 3 Drawing Sheets

INTEGRATED CIRCUIT TRAY WITH FLEXURAL BEARINGS

This invention relates generally to the manufacture of conductor integrated circuit chips and more specifically to a tray used to hold integrated circuit chips during steps in the manufacturing process.

In the manufacture of semiconductor integrated circuit chips ("chips"), the chips are placed in trays. Each tray holds many chips and allows the chips to be transported or processed by a machine simultaneously. For example, an automatic test system might have 32 test sites which enable it to test 32 chips simultaneously. A tray with 32 bins aligned with the 32 test sites on the tester is used to hold the chips during testing.

The bins of the tray are generally identical and are configured to hold the specific type of chip being processed. For example, a bin might have structures to align the leads of chip in the positions that match contactors of the test system. Posts are also included in each bin. The posts align the chip in the bin or could be used to align the bin to the test system.

Trays are molded of plastic so that they can be of low cost and light weight. However, molded plastic parts generally have poor positional tolerances. The tolerances are worse for larger parts. Thus, a tray, which is a relatively large part, is particularly susceptible to poor positional tolerances. Poor tolerances are a problem because the chips are not held in the tray in the right positions relative to the work sites that must contact the chips. For example, if the tolerances are too large, chips in one part of the tray might be properly aligned with the work site, but chips in other parts might not be.

One approach to avoiding this problem is described in O'Conner et al., U.S. Pat. No. 5,131,535. That patent describes a tray in which the bins are separately made of a plastic type material. However, the bins are inserted into a metal frame that has better positional tolerances than a molded plastic part of similar size. That patent describes that the bins can move up and down—normal to the surface of the tray—to make slight adjustments for differences in heights of the bins relative to the test sites. These adjustments help to ensure that all of the chips to be tested at once actually make contact with the test sites.

This tray design corrects only for inaccuracies in a direction normal to the surface of the tray (the z-direction). It relies on a costly metal frame to provide the positional accuracy across the surface of the tray.

An alternative tray design has both a frame and the bins made of plastic. The plastic frame establishes a grid, with one grid cell for each bin. The grid cells are larger than the bins such that the bins can slide around within the cell. This motion corrects for poor positional tolerance in directions parallel to the surface of the tray (the X–Y directions).

Each of these approaches compensates for positioning inaccuracies in only limited directions. The former only in the Z direction, the latter only in the X–Y directions. It would be desirable to provide a tray that provides compliance of the bins with a full six degrees of freedom.

Each of these approaches also requires that the trays be assembled from numerous parts, as each bin is separate. Complex assemblies are undesirable because of the cost. It would be desirable to reduce the number of components.

We have noted several disadvantages with trays that have bins sliding within a plastic frame. Mold flashing from semiconductor components sometimes falls off the chips and clogs the slides. Also, in molding the plastic frame, mold flashing sometimes is left in tracks on which the bins slide.

The mold flashing causes friction between the bins and the tracks. The friction causes the parts to wear out or can prevent the bins from sliding in the frame as desired. If the bins to not slide properly, the chips will not be properly aligned as they are processed. This might cause the chips to jam in the processing equipment. Jams are highly undesirable because they can require the manufacturing operation to stop, which involves significant costs.

Another disadvantage of using a tray with sliding bins is that the friction between the bins and the frame changes if the tray warps or flexes. This can change the response characteristics of the bins or, in extreme cases, contribute to jamming.

A further problem with the use of trays that have bins that slide in the X–Y plane is that they are only well suited for use with equipment that processes the chips with the tray horizontal. Some equipment processes the chips with the tray held vertically. If a tray with sliding bins is held vertically, all of the bins will slide to the bottom of their range. On average the bins will then have to be forced to make a much larger adjustment than if they had started out in the center of the cell. The greater the adjustment that is needed to align the chips with the work sites, the more likely it is that there will be wear or jamming.

As will be described in more detail below, we have solved these problems with an improved tray using flexural bearings. Flexural bearings have been used in other applications such as optical alignment systems and coupling elements in drive systems. However, flexural bearings are generally two degree-of-freedom systems. In some rare instances, flexural bearings are used to provide five degrees of freedom if they are shaped like coiled springs or bellows to form shaft couplings. These designs are discussed in the reference text *Precision Machine Design*, Prentice Hall, Englewood Cliffs, N.J. 1992, ISBN 0-13-719972-4 by Alexander H. Slocum, which is hereby incorporated by reference.

SUMMARY OF THE INVENTION

With the foregoing background in mind, it is an object of the invention to provide a low cost chip tray.

It is also an object to provide a chip tray that has compliance in up to six degrees of freedom independently for each chip in the tray.

It is a further object to provide a chip tray that has self centering chip support platforms.

The foregoing and other objects are achieved in a chip tray that has bins coupled to a frame through a series of flexural bearings. In a preferred embodiment, the frame, bins and flexural bearings are integrally molded of plastic.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
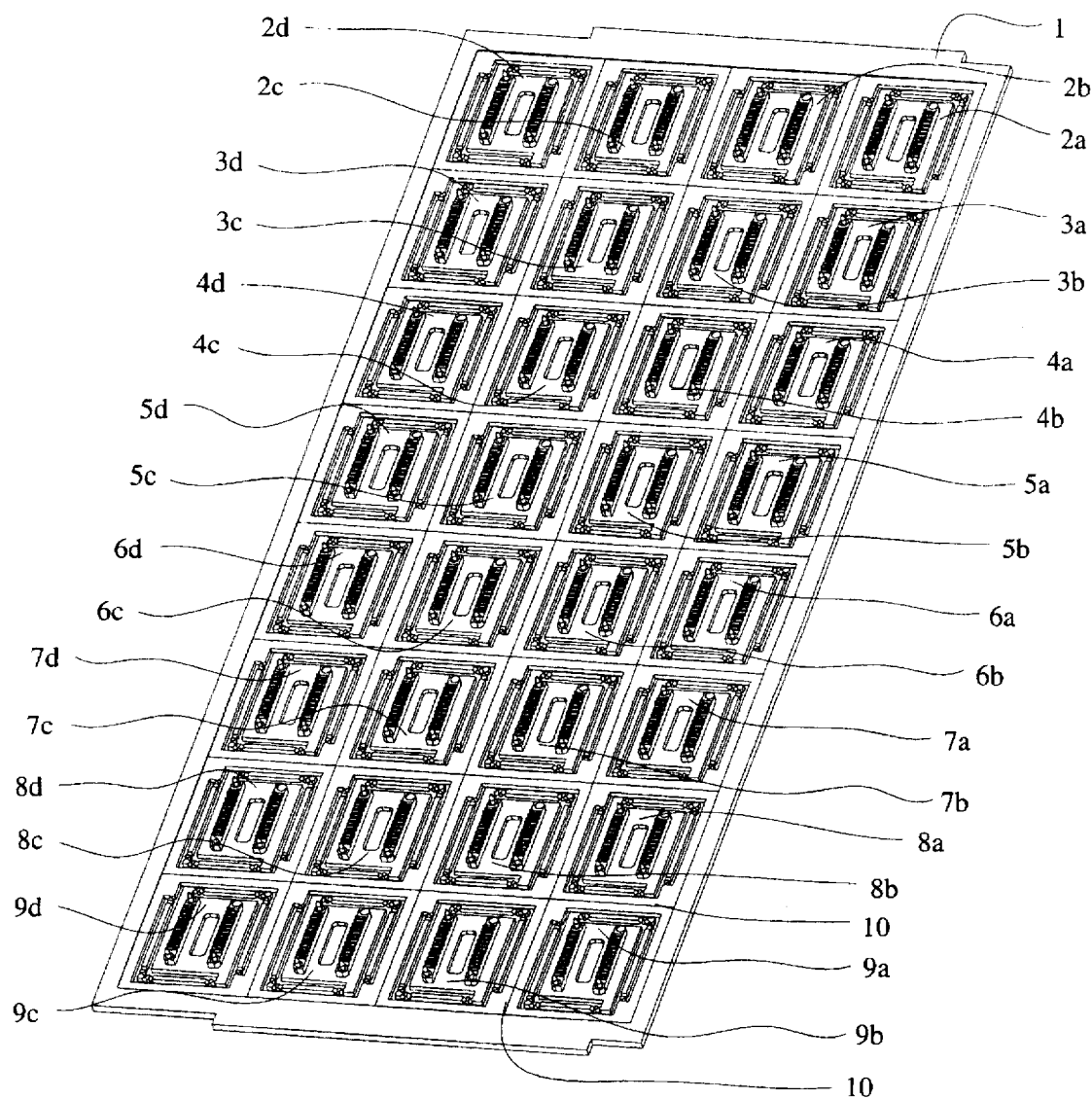
FIG. 1 is a drawing of a chip tray according to the invention.

FIG. 1 shows a chip tray 1 capable of holding 32 chips. It has eight rows of four bins, labeled 2a . . . 2d, 3a . . . 3d, 4a . . . 4d, 5a . . . 5d, 6a . . . 6d, 7a . . . 7d, 8a . . . 8d and 9a . . . 9d. The bins are attached to portions of the tray, which forms a grid 10 between the bins.

Tray 1 is, in a preferred embodiment, molded of plastic. A low static plastic of the type normally used in semiconductor holding devices is preferred. Preferably, the entire tray and all of the bins are integrally molded in one operation. The number and configuration of the bins is not important to the invention and will be dictated by the semiconductor processing operation. Also, tray 1 will have structures that allow it to be held and manipulated during the semiconductor processing operation. Such structures will be as in the prior art and are not expressly shown in the drawings.

Each of the bins 2a . . . 2d, 3a . . . 3d, 4a . . . 4d, 5a . . . 5d, 6a . . . 6d, 7a . . . 7d, 8a . . . 8d and 9a . . . 9d is, in the preferred embodiment, identical. FIG. 2a shows bin 2a in greater detail. Bin 2a holds a chip (not shown) on platform 60. The specific shape and features of platform 60 are dictated by the type of chip to be held in tray 1 (FIG. 1).

In the illustrated embodiment, platform 60 includes slots 50b separated by guides 50a. Slots 50b receive leads of the chip.

Central hole 90 allows back side access to the chip (not shown) on platform 60. This access can be used for such things as blowing temperature controlled air onto the chip (not shown) during testing or processing.

Posts 80, 81 and 82 can be used to align the chip (not shown) on platform 60. Such posts are useful when the chip has a carrier-type lead frame. Posts 80, 81 and 82 pass through holes in the lead frame to position the chip.

Posts 80, 81 and 82 are also used to position platform 60 relative to test sites on automatic test equipment or work sites on other semiconductor processing equipment to which the chips (not shown) in tray 1 (FIG. 1) will be presented. For example, they will be used to guide the chip (not shown) on platform 60 into a task site of a contactor of a handler.

Platform 60, including slots 50b, posts 80, 81 and 82 and central hole 90 are as in the prior art. Platform 60 differs from the prior art in the way that it is attached to tray 1 (FIG. 1). Specifically, platform 60 is attached to frame 10 of tray 1 through a flexural bearing system that allows up to six degrees of freedom. Each of the bins 2a . . . 2d, 3a . . . 3d, 4a . . . 4d, 5a . . . 5d, 6a . . . 6d, 7a . . . 7d, 8a . . . 8d and 9a . . . 9d includes a platform 60 coupled through a like bearing system. These flexural bearing systems allow the platforms in each of the bins to move independently with up to six degrees of freedom. Therefore, when the tray is presented to numerous work sites, all of the chips (not shown) in the tray will be properly aligned with their respective work sites regardless of inaccuracies in the manufacture of tray 1 or the positioning of the work sites.

Figure 2:
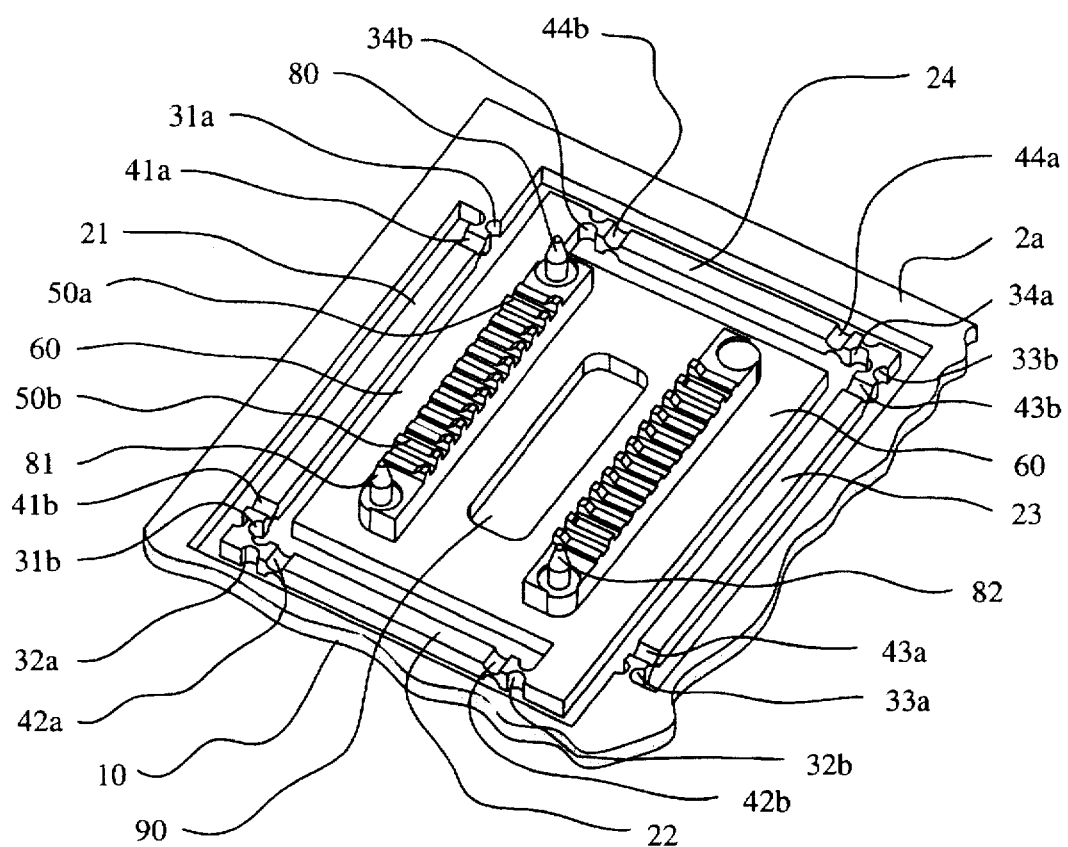
FIG. 2 is an expanded view of one of the bins in the chip tray of FIG. 1.

In the preferred embodiment, the flexural bearing system for bin 2a includes four beams 21, 22, 23 and 24. Each of the beams includes at each end a flexural bearing that can flex with at least two degrees of freedom, in order to obtain a full six degrees of freedom for the motion of platform 60. The beams are in pairs, with one end of each beam in each pair being connected through the flexural bearings at a right angle. Specifically, beams 21 and 22 form one pair and beams 23 and 24 forming a second pair. In each pair, the other end of one beam is connected to the frame 10 and the remaining end of the other beam is connected to platform 60. In FIG. 2, beams 21 and 23 are connected to frame 10. Beams 22 and 24 are connected to platform 60.

The flexural bearings used in the embodiment of FIG. 2 are made of two hinges at right angles, 31a and 41A; 31b and 41b; 32a and 42A; 32b and 42b; 33a and 43A; 33b and 43b; 34a and 44A; 34b and 44b. In the embodiment of FIG. 2, each hinge is formed by forming symmetric indentations into opposing sides of the beam. The resulting hinges are shaped as "hour glasses". Because the hinges in each flexural bearing are at right angles, the resulting bearing has a "crossed hour glass" shape.

The flexural bearing system illustrated in FIG. 2 is made of relatively simple elements. It consists of beams with a few indentations to allow flexibility. However, the resulting flexural bearing assembly system is quite complex. Each flexural bearing is essentially a Hooke's joint. The four beams and flexural bearings work together to allow platform 60 to move with six degrees of freedom. It can "float" relative to frame 10. Thus, each chip in each bin can be aligned with its respective work site by positioning posts 80, 81 and 82.

The beams 21, 22, 23 and 24 run, to the greatest extent possible, along the length of each side of platform 60. It is preferable that the beams be made as long as possible to minimize their stiffness and increase the ease with which platform 60 "floats."

The six degrees of freedom can be seen by defining a Cartesian coordinate system with the X direction parallel with beams 22 and 24 and the Y direction parallel with beams 21 and 23. The Z direction is then normal to the surface of platform 60.

Hinges 31a, 31b, 32a, 32b, 33a, 33b, 34a and 34b can be flexed in the same or opposing directions to allow any combination of translation or rotation within the X-Y plane. For example, during translational motion in the X direction, hinges 31a and 33a will flex in the same direction. During rotation in the X-Y plane, they will flex in opposing directions.

Hinges 41a, 41b, 42b, 43a, 43b, 44a and 44b can be flexed to allow translation in the Z direction or rotation about either the X or Y axes. For example, hinges 42a and 44a will flex in the opposite direction for translation in the Z direction. They will flex in the same direction for rotation around the Y axis. Likewise, hinges 41a and 43a will flex in the opposite direction during translation in the Z direction, but will flex in the same direction for rotation around the X axis.

Beam 21 works in parallel with beam 23 to form essentially a four bar linkage, because beam 23 has orthogonal hourglass hinges 33b and 43b on one end, and 33a and 43a on the other end. Together beams 21 and 23 allow for motion in the X direction. Note that beams 21 and 23 are cantilevered beams, and in order to minimize their stiffness (which is desirable), their ends must be un-guided and not axially restrained, so they are coupled to the platform 60 through flexural beams 22 and 24, respectively. The end of beam 21 is attached to the end of beam 22, where that end of flexural beam 22 has orthogonal hourglass hinges 32a and 42a. The other end of beam 22 is attached to the platform 60 by orthogonal hourglass hinges 32b and 42b. Just as beam 22 connects beam 21 to the platform 60 without restraining the desired motion of the tip of beam 21 so as to minimize stiffness (which is desired for flexural bearing motion), beam 21 does the same for beam 22. The collection of hourglass hinges 31b, 41b, 32a, and 42a all act to prevent transfer of moments between the tips of beams 21 and 22 which minimizes stiffness of the flexure and maximizes the range of motion. Similarly, beam 24 is supported at its ends by orthogonal flexural hinges 34b, 44b, 34a, and 44a. And similarly, beam 22 and 24 work together as a four-bar linkage to provide for motion in the Y direction. And beams 24 and 23 guide each others' tips without restraining them in the desired motion directions, and provide connection between the platform 60 and the frame 10.

To achieve motion in the Z direction without causing undo undesirable pitch or yaw resistance, beams 21 and 22 work as a flexible orthogonal pair where one beam's flexing accommodates the change in projected length and slope of the other beam to allow for virtually unrestrained vertical motion. Similarly, beams 24 and 23 work together. Again, the orthogonal hourglass flexural bearing hinges provide flexibility in two directions for each end of the connecting beams.

To allow for rotational degrees-of-freedom, once again the beams will act as orthogonal pairs where one beam guides the end of the other without restraining it. For example, right-hand-rule rotation about the Z axis, the tip of beam 23 must deflect in the negative X direction. Hourglasses 33b and 34a guide the X direction motion of the end of beam 23 to transfer it to the platform 60, but they do so without restraining the slope at the end of beam 23, so as to minimize the force required to bend the beam 23. Similarly, beam 21 bends in the positive X direction and its tip motion is transferred to the structure 60 by beam 22. The result is compliance in rotation about the Z axis. The use of the pairs of beams with flexural coupled connections minimizing moments between the ends of the beams increases flexibility and range of motion.

For angular compliance about the Y axis, the ends of beams 23 and 24 move in the positive Z direction, and the beams' ends' slopes and small Y and X direction deflection components are unrestrained because of the flexibility of the connection to-and provided by-each beam to each other. Similarly, beams 22 and 21 ends deflect in the negative Z direction where their interconnected ends are unrestrained by the orthogonal flexibility of the beams.

For angular compliance about the Y axis, beam 24's hourglass flexures 34b and 44b move in the positive Z direction, and the hourglass flexures 44a, 34a, flex and move in the negative Z direction. In addition, some flexibility is also gained, as is the case for rotation about the X axis, by deflection of the orthogonal connected beam 23. Also, beams 22 and 21 function together as a system in a similar manner, moving in the negative Z direction.

Beams 21, 22, 23 and 24 hold platform 60 at a nominal position centered within the frame 10. Platform 60 will be held in this position regardless of the orientation of tray 1. This ability makes tray 1 well suited for use with handlers that hold the chips in a vertical position for testing.

Also, it should be noted that platform 60 "floats" without sliding on frame 10. It therefore does not jam if there is mold flashing on frame 10. A tray according to the invention is likewise immune to dirt buildup on the frame. As a further advantage, it should be noted that warping or flexing of tray 1 does not change the response characteristics of tray 60. The resulting tray is therefore extremely robust.

Having described one embodiment, numerous alternative embodiments or variations might be made. For example, it was described that tray 1 is molded of plastic. The tray might be made of other materials. It also be made in other ways, such as by stamping from a sheet or milling.

Though integral molding is desirable because it provides a lost cost method of manufacture, it is not necessary. The bins, including the flexures, might be made individually and then organized in a frame which might be made of metal or plastic.

Figure 3:
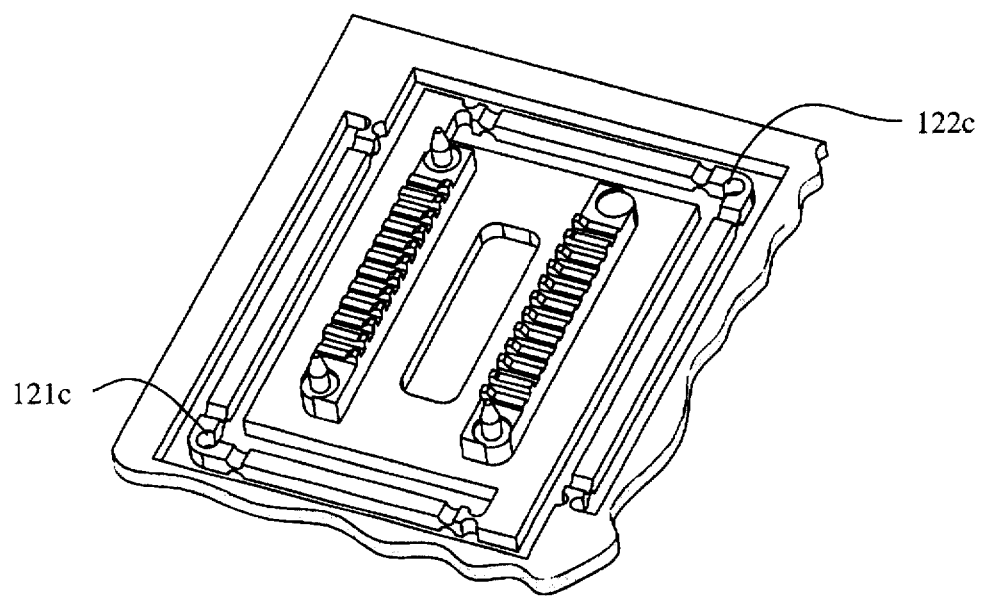
FIG. 3 is a view of an alternative embodiment of the bin of FIG. 2.

FIG. 3 shows a an alternative construction for some of the flexural bearings. Hinges 34a and 33b might be replaced by a single thin curved beam 122c. Hinges 31b and 32a might also be similarly replaced with a single thin curved beam 121c. Beams 121c and 122c provide the same relative flexural, motion for beams 21, 22, 23 and 24.

Figure 4:
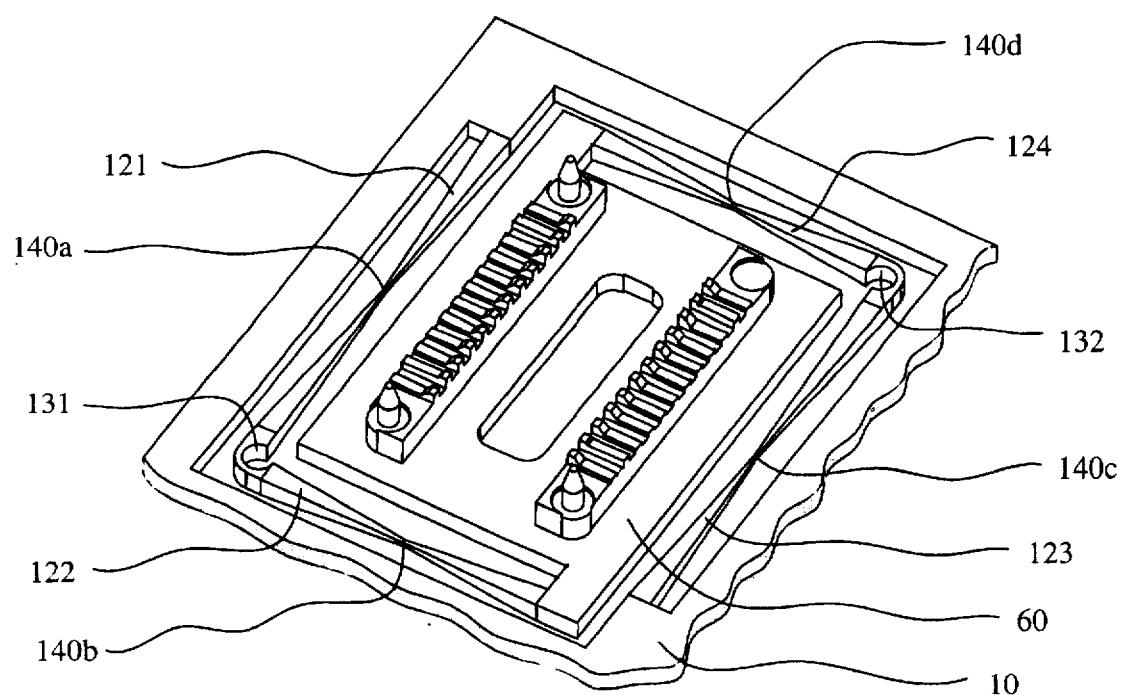
FIG. 4 is a view of a second alternative embodiment of the bin of FIG. 2.

FIG. 4 shows a still further alternative embodiment. FIG. 4 shows that beams 121, 122, 123 and 124 are used in place of beams 21, 22, 23 and 24. Beams 121, 122, 123 and 124 tapered hourglass shaped sections with waists 140a, 140b, 140c and 140d, respectively. Beams 121 and 122 are connected by flexure 131. Beams 123 and 124 are connected by flexure 132. Beams 121, 122, 123 and 124 taper into waists 140a, 140b, 140c and 140d, respectively, in two dimensions. Thus, they can flex in the same directions as pairs of hinges shown in FIG. 2. The long tapered sections, however, create a more uniform stress.

Thin, constant cross-sectioned beams might also be used. Thin beams might, in some circumstances, provide the required flexural compliance. However, such beams would provide a limited range of motion.

Moreover, it is not necessary that the beams run along the length of platform 60, though longer beams generally provide a greater range of motion and having the beams run parallel with the edges of platform 60 makes a more compact structure. However platform 60 might be attached to frame 10 at multiple points through a structure that more resembles a coil spring. Such a coiled spring type structure might be created with beams that are zig-zagged with flexural bearings at their joints.

It should be appreciated that other types of flexures might be used. For example, elastic diaphragms, twisted flat bar links, rolling bellows and other membrane and spring-type structures could be used to provide up to six degrees of freedom to platform 60. Any of these systems could be optimized to minimize stiffness and stress by one skilled in the art of stress deflection analysis.

As an example of another modification, it should be noted that some prior art trays provide compliance to the chip bins with only two degrees of freedom. If desired, half of the hinges might be eliminated. For example, hinges 41a, 41b, 42a, 42b, 43a, 43b, 44a and 44b might be eliminated if compliance only in the X-Y plane is required.

Also, it should be noted that the flexural bearing system of the invention includes pairs of beams 21, 22 and 23, 24. The beams in each pair are coupled at right angles to reduce stiffness are increase range of motion. Some benefits of the invention could be achieved if beams 21 and 23 were coupled to platform 60 by means of a flexural bearing.

Therefore, the invention should be limited only by the spirit and scope of the appended claims.

What is claimed is:

1. A tray for holding semiconductor chips, the tray comprising:
   a) a platform;
   b) a frame;
   c) at least one beam; and
   d) a plurality of flexural bearings coupling the at least one beam to the platform and to the frame so that the platform can move with respect to the frame with multiple degrees of freedom.

2. The tray of claim 1 wherein the platform, frame, beam and flexural bearings are integrally molded.

3. The tray of claim 1 wherein each flexural bearing comprises a pair of hinges, with the hinges in each pair allowing flexure in orthogonal directions.

4. The tray of claim 3 wherein each of each hinge comprises recesses in opposite sides of the beam.

5. The tray of claim 1 wherein the at least one beam comprises four beams and wherein each of the beams has two ends with one of the plurality of flexural bearings at each of the ends.

6. The tray of claim 5 wherein pairs of the beams are joined at right angles at one end and one of the pair of beams is joined to the frame at one end and the other of the pair of beams is joined to the platform at one end.

7. A tray for holding semiconductor chips, the tray comprising:
 a) a frame;
 b) a plurality of platforms;
 c) a plurality of flexural bearing systems, each joining one of the platforms to the frame while allowing motion of the platform with six degrees of freedom with respect to the frame.

8. The tray of claim 7 wherein the frame, plurality of platforms and plurality of flexural bearing systems are integrally formed of a plastic.

9. The tray of claim 7 wherein the flexural bearing system comprises four beams, each having two ends, and a plurality of flexural bearings, with the beams organized into pairs, with the beams of each pair being joined together at one end of each beam through a portion of the plurality of flexural bearings and one end of one of the beams of each pair being joined to the frame through a portion of the plurality of flexural bearings and one end of the other of the beams in each pair being joined to the platform through a portion of the plurality of flexural bearings.

10. The tray of claim 7 wherein each of the plurality of flexural bearing systems comprises four beams, each of the beams having a tapered cross-section.

11. The tray of claim 7 wherein each of the flexural bearing systems comprises:
 a) a first beam having two ends, with one end being coupled to the frame;
 b) a second beam having two ends, orthogonal to the first beam, with one end being coupled to the platform; and
 c) at least one flexural bearing coupling one end of the first beam to one end of the second beam.

12. The tray of claim 11 wherein the flexural bearing comprises:
 a) a first hinge and a second hinge, at right angles with the first hinge, integrally formed with the first beam; and
 b) a third hinge and a fourth hinge, at right angles with the first hinge, integrally formed with the second beam.

13. The tray of claim 12 additionally comprising a second flexural bearing and a third flexural bearing and wherein the first beam is coupled to the frame through the second flexural bearing and the second beam is coupled to the platform through the third flexural bearing.

14. The tray of claim 11 wherein the each of the first beam and the second beam is tapered.

15. A tray for holding semiconductor chips, the tray comprising:
 a) a plurality of bins organized in a plurality of rows, each of the bins including a platform;
 b) a frame;
 c) a plurality of sets of beams, each set of beams connecting one of the platforms to the frame and the beams in each of the sets being organized in pairs with the beams in each pair being coupled at right angles so that the platform can move with respect to the frame with multiple degrees of freedom.

16. The tray of claim 15 wherein each of the beams includes means for providing flexural motion.

17. The tray of claim 16 wherein the means for providing flexural motion comprises a crossed hourglass shaped flexural hinges.

18. The tray of claim 16 wherein the means for providing flexural motion comprises tapers along the length of the beams.

19. The tray of claim 16 wherein the means for providing flexural motion comprises means for providing motion of the platform with six degrees of freedom.

20. The tray of claim 16 wherein the means for providing flexural motion comprises means for providing motion of the platform with less than six degrees of freedom.

21. The tray of claim of 15 wherein the plurality of bins comprises at least 32 bins.

22. The tray of claim 15 wherein the each platform is joined to the frame by two of the plurality of sets of beams.

* * * * *